(12) United States Patent
Glaser et al.

(10) Patent No.: US 12,218,593 B2
(45) Date of Patent: Feb. 4, 2025

(54) HALF-BRIDGE CIRCUITS WITH SYMMETRICAL LAYOUT OF PARALLEL TRANSISTORS AND CAPACITORS

(71) Applicant: Efficient Power Conversion Corporation, El Segundo, CA (US)

(72) Inventors: John S. Glaser, Niskayuna, NY (US); Yuanzhe Zhang, Torrance, CA (US); Michael A. de Rooij, Playa Vista, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 219 days.

(21) Appl. No.: 17/942,803

(22) Filed: Sep. 12, 2022

(65) Prior Publication Data

US 2023/0083279 A1    Mar. 16, 2023

Related U.S. Application Data

(60) Provisional application No. 63/243,462, filed on Sep. 13, 2021.

(51) Int. Cl.
*H02M 3/158* (2006.01)
*H02M 3/00* (2006.01)

(52) U.S. Cl.
CPC ............ *H02M 3/158* (2013.01); *H02M 3/003* (2021.05)

(58) Field of Classification Search
CPC ...... H02M 3/158; H02M 3/003; H02M 7/003; H02M 7/5387
See application file for complete search history.

(56) References Cited

U.S. PATENT DOCUMENTS

| | | | |
|---|---|---|---|
| 9,035,417 B2 | 5/2015 | Reusch et al. | |
| 9,537,400 B2 | 1/2017 | Noebauer | |
| 11,019,718 B2 | 5/2021 | Glaser et al. | |
| 2009/0273291 A1 | 11/2009 | Huber et al. | |
| 2014/0117495 A1* | 5/2014 | Li | H02M 3/155 438/107 |
| 2016/0065065 A1* | 3/2016 | Noebauer | H02M 3/1588 323/271 |
| 2017/0093285 A1* | 3/2017 | Sasao | H02M 3/158 |
| 2021/0175165 A1 | 6/2021 | Shibuya et al. | |

FOREIGN PATENT DOCUMENTS

| | | |
|---|---|---|
| EP | 3 151 406 A1 | 4/2017 |
| TW | 200730031 A | 8/2007 |
| TW | 201626848 A | 7/2016 |
| WO | WO 2021/056592 A1 | 4/2021 |

* cited by examiner

*Primary Examiner* — Adolf D Berhane
*Assistant Examiner* — Jye-June Lee
(74) *Attorney, Agent, or Firm* — Blank Rome LLP

(57) ABSTRACT

A physical arrangement of at least two power switches and at least one capacitor in a power loop. At least one of the switches is formed of at least two parallel electronic devices, such as transistors. The arrangement minimizes total power loop impedance and results in approximately equal impedance in each parallel branch of the switch formed of two parallel devices, thereby resulting in approximately equal currents in the switches.

9 Claims, 9 Drawing Sheets

HALF-BRIDGE CIRCUITS WITH SYMMETRICAL LAYOUT OF PARALLEL TRANSISTORS AND CAPACITORS

This application claims the benefit of U.S. Provisional Application No. 63/243,462, filed on Sep. 13, 2021, the entire disclosure of which is hereby incorporated by reference.

FIELD OF THE INVENTION

The present invention relates generally to a half-bridge switching circuit, and more particularly to the physical layout of a half-bridge switching circuit with multiple parallel transistors.

BACKGROUND

The basic building block of most power switching converters is a switching cell comprising a loop of two switches arranged in a half-bridge circuit and a capacitor, to which inductors, power sources and loads may be attached. A typical half-bridge circuit with transistor switches is illustrated in FIG. 1. Transistors Q1, Q2, and capacitor $C_{HF}$ form a power loop, with the output at $V_{SW}$.

Due to practical limitations on the transistor switches, which are shown in FIG. 1 as FETs, it is often beneficial to connect multiple transistors in parallel so that they operate as a single large switch. This allows the switch to conduct higher currents while maintaining normal operation.

In order to obtain the maximum benefit from paralleling transistors to form a transistor switch that is part of a half-bridge, the paralleled transistors should share current equally. In order to do this, the impedance of each parallel path should be approximately equal. This path includes the paralleled transistors forming the switch and their physical connection to the other switch and capacitor forming the power loop. At the same time, it is important to minimize the physical length of the power loop to reduce impedance.

Accordingly, the physical arrangement or layout of power switching converters with paralleled transistors can become a limiting factor in performance because the layout of components has a significant effect on the impedances of parallel paths. An improved arrangement or circuit board layout is desirable to reduce loop impedance and achieve approximately equal impedance in each parallel branch of the switch comprising parallel devices.

SUMMARY OF THE INVENTION

The present invention provides an arrangement or layout for a half-bridge switching circuit in which either the high-side switch or the low-side switch, or both, is formed of two transistors connected in parallel and disposed on a circuit board in a symmetrical layout. The arrangement also includes a plurality of capacitors disposed on the circuit board in a symmetrical layout, each capacitor forming a power loop with a respective high-side transistor and a low-side transistor. The power loops of the half-bridge switching circuit each have substantially equal impedance due to the symmetrical layouts of the transistors and capacitors on the circuit board.

In one embodiment, only the high-side switch is formed of two transistors connected in parallel, and the low-side switch is a single transistor. In another embodiment, only the low-side switch is formed of two transistors connected in parallel, and the high-side switch is a single transistor. Each of the two transistors connected in parallel forms a power loop with the single transistor and a capacitor, resulting in two power loops having substantially equal impedances. The capacitors can be disposed laterally outside or between the high-side or low-side transistors of the respective power loop in a symmetrical fashion.

In yet another embodiment, the power capability of the circuit is increased by forming both the high-side switch and the low-side switch of multiple transistors connected in parallel. Each of the multiple transistors connected in parallel, high-side and low-side, forms a power loop with the other respective low-side or high-side transistor and a capacitor. The multiple power loops each have a substantially equal impedance by disposing the high-side and low-side transistors alternately on the circuit board, with the corresponding capacitor of each power loop being disposed between the alternating high-side and low-side transistors.

The transistors connected in parallel are preferably FET transistors, and, due to the symmetrical arrangement, have substantially equal impedance to the switch node.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings, in which like reference characters identify correspondingly elements throughout, and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed, and that various structural, logical, and electrical changes may be made.

In an asymmetrical half-bridge circuit, as described below, the number of FETs forming the high-side switch is different from the number of FETs forming the low-side switch.

Figure 1:
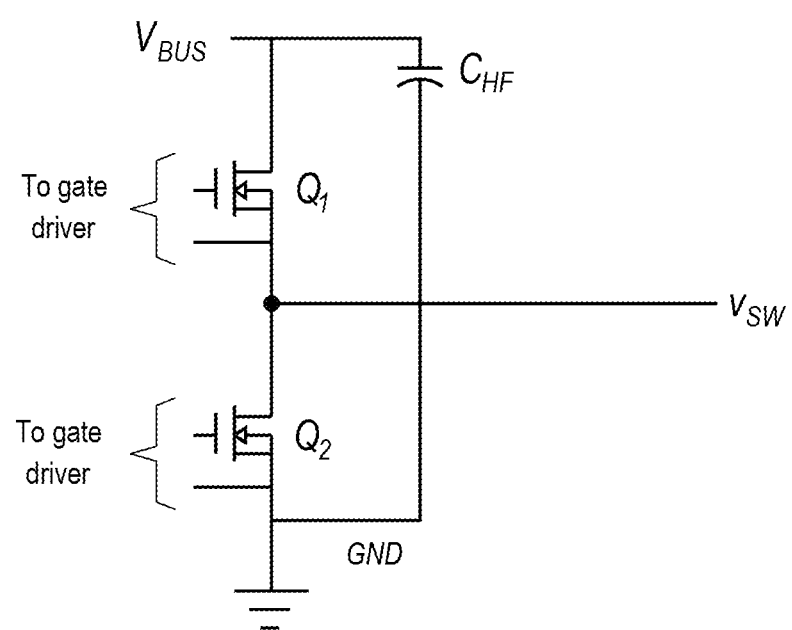
FIG. 1 illustrates a typical prior art half-bridge circuit.
Figure 2:
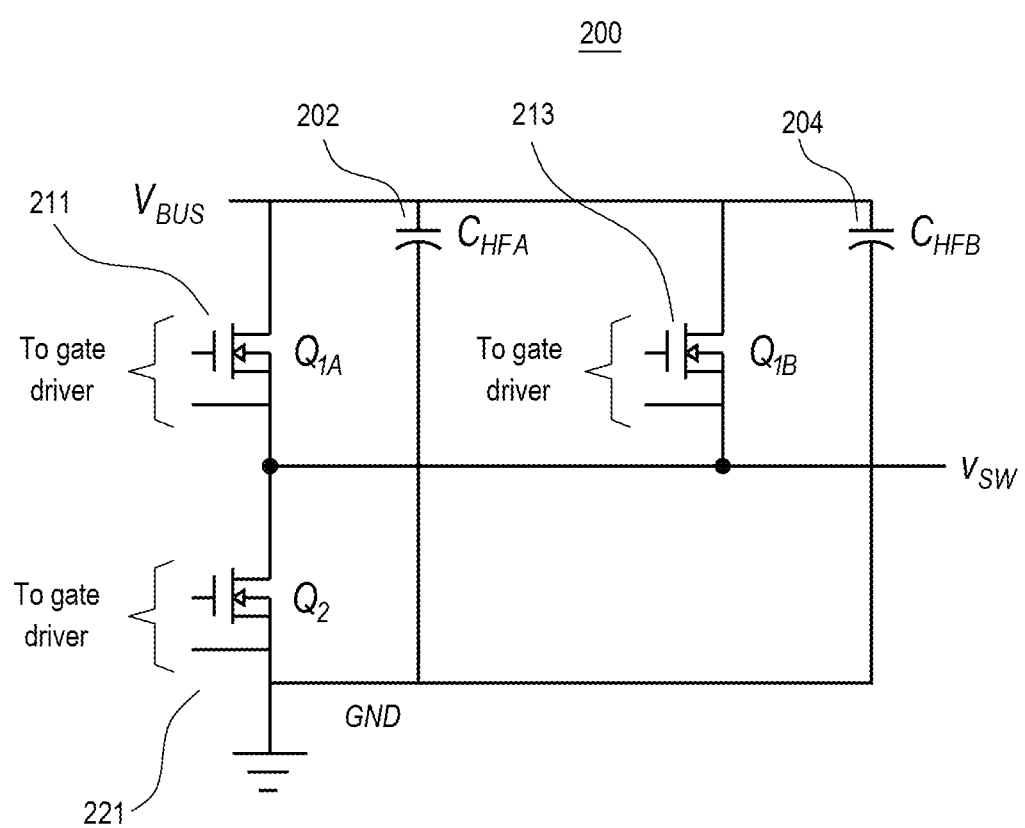
FIG. 2 illustrates an asymmetrical half-bridge circuit in accordance with the present invention with two high-side FETs connected in parallel.

FIG. 2 illustrates an asymmetrical half-bridge circuit 200 in accordance with a first embodiment of the present invention. The asymmetrical half-bridge circuit 200 includes a high-side switch and a low-side switch, where the high-side switch 210 is formed of two parallel FETs, namely FET ($Q_{1A}$) 211 and FET ($Q_{1B}$) 213, and the low-side switch 220 is a single FET ($Q_2$) 221. Since the high-side switch 210 is formed of more FETs than the low-side switch 220, the high-side switch 210 can support higher switch currents than the low-side switch 220. The two parallel FETs 211 and 213 (which together form high-side switch 210) are connected to and controlled by a same gate driver, while low-side FET 221 is connected to and controlled by a different gate driver. The two parallel FETs 211 and 213 are connected between a switch node $V_{SW}$ and $V_{BUS}$, while low-side FET 221 is connected between the switch node $V_{SW}$ and ground (GND). $V_{BUS}$, and $V_{SW}$ are terminals that allow power to enter and leave the half-bridge, and GND is a reference for the other voltages, which may be (but is not necessarily) 0 volts.

Capacitor 202 and capacitor 204, preferably parallel chip capacitors, are each connected between $V_{BUS}$ and GND. The two parallel FETs 211 and 213 operate as a single large switch 210, which allows the switch to conduct higher currents while maintaining normal operation. By implementing the additional FET 213 and additional capacitor 204 in the layout arrangements shown in FIGS. 3 and 4, the two power loops of the circuit advantageously have substantially identical impedances.

Figure 3:
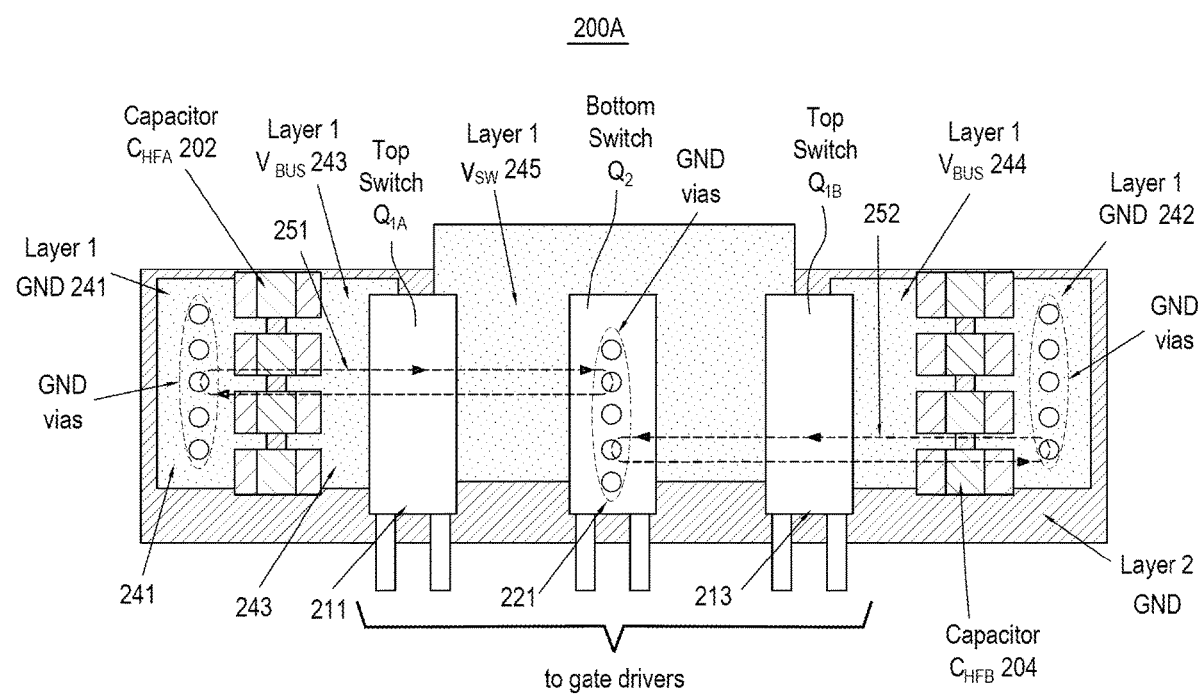
FIG. 3 illustrates the physical layout of the asymmetrical half-bridge circuit of FIG. 2 with capacitors arranged laterally outside respective high-side and low-side FETs.

FIG. 3 illustrates a first embodiment of the physical layout of asymmetrical half-bridge circuit 200 on a multi-layer printed circuit board (PCB). In physical layout 200A, capacitors 202, 204 are each arranged laterally outside respective high-side (top) and low-side (bottom) FETs. More specifically, capacitor 202 is laterally outside high-side FET 211 and low side FET 221 (instead of between high-side FET 211 and low-side FET 221, as described below in connection with the second embodiment), and capacitor 204 is laterally outside high-side FET 213 and low-side FET 221. The PCB includes a first layer (layer 1) and a second layer (layer 2) as shown. Layer 2, the bottom layer, is GND, and layer 1, the top layer, includes a first GND portion 241 and a second GND portion 242 each being conductively connected to GND of layer 1 by respective GND vias. Layer 1 further includes a first power input $V_{BUS}$ portion 243, a second power $V_{BUS}$ portion 244, and a switch-node (SN) $V_{SW}$ portion 245.

Physical layout 200A includes a first power loop 251 and a second power loop 252. As shown, the first power loop 251 includes high-side (top) FET 211, low-side (bottom) FET 221, and capacitor 202. The second power loop 252 includes high-side (top) FET 213, low-side (bottom) FET 221, and capacitor 204.

The first power loop 251 extends from a first terminal of capacitor 202 to a $V_{BUS}$ portion 243 of the first layer, from $V_{BUS}$ portion 243 of the first layer to the first high-side (top) FET ($Q_{1A}$) 211 on the first layer, from the first high-side (top) FET ($Q_{1A}$) 211 to $V_{SW}$ portion 245 of first layer, from $V_{SW}$ portion 245 of first layer to the low-side (bottom) FET ($Q_2$) 221 on the first layer. The first power loop 251 further extends from low-side (bottom) FET ($Q_2$) 221 on the first layer (upper layer) to GND in the second layer (lower layer) through GND vias and extends from the GND portion in the second layer and under bottom FET ($Q_2$) 221 to the GND portion in the second layer and under GND portion 241 of first layer, and extends from the GND portion in the second layer (lower layer) and under GND portion 241 of first layer (upper layer) to GND portion 241 of the first layer through respective GND vias, and further extends to the second terminal of capacitor 202.

The second power loop 252 extends from a first terminal of capacitor 204 to $V_{BUS}$ portion 244 of the first layer, from $V_{BUS}$ portion 244 to second high-side (top) FET ($Q_{1B}$) 213 on the first layer, from second high-side (top) FET ($Q_{1B}$) 213 to $V_{SW}$ portion 245 of first layer, from $V_{SW}$ portion 245 of first layer to low-side (bottom) FET ($Q_2$) 221 on the first layer. The second power loop 252 further extends from low-side (bottom) FET ($Q_2$) 221 on the first layer to GND in the second layer through GND vias, extends from the GND portion in the second layer and under low-side (bottom) FET ($Q_2$) 221 to the GND portion in the second layer and under GND portion 242 of the first layer, and extends from the GND portion in the second layer and under GND portion 242 of the first layer to GND portion 242 of the first layer through respective GND vias, and further extends to the second terminal of capacitor 204.

The two power loops 251, 252 have the same distances between components, and thus have substantially identical impedances. Accordingly, physical layout 200A provides dual power loops with substantially equal impedance for an asymmetrical half-bridge (i.e., unequal numbers of FETs for high-side switch 210 and low-side switch 220).

Note that the vias are depicted with dashed lines as they do not penetrate the FET and are underneath the FETs. The vias connect the appropriate FET terminal to the corresponding Layer 2 node.

Figure 4:
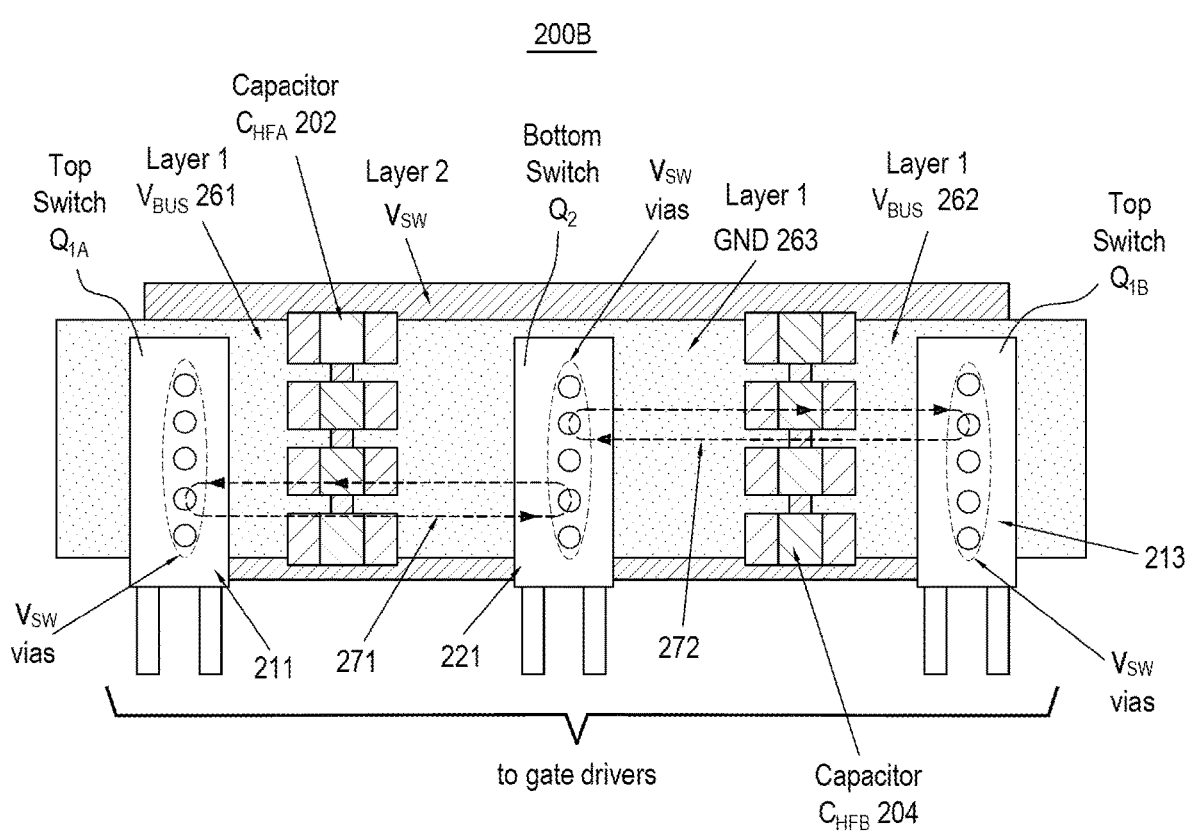
FIG. 4 illustrates another physical layout of the asymmetrical half-bridge circuit of FIG. 2 with capacitors arranged between respective high-side and low-side FETs.

FIG. 4 illustrates a second embodiment of the physical layout of asymmetrical half-bridge circuit 200 on a PCB in accordance with the present invention. In layout 200B, capacitors 202 and 204 each are laterally between, rather than being laterally outside, the respective high-side (top) FET 211/213 and the low-side (bottom) FET 221. The second layer (layer 2) of the PCB serves as the switch node $V_{SW}$, and the first layer (layer 1) of the PCB includes a first power-node $V_{BUS}$ portion 261, and a second power $V_{BUS}$ portion 262, and a GND portion 263. The first high-side (top) FET 211 and the second high-side (top) FET 213 on the first layer are each conductively connected to the switch node $V_{SW}$ of the second layer by respective $V_{SW}$ vias.

Physical layout 200B includes a first power loop 271 and a second power loop 272. As shown, the first power loop 271 includes high-side (top) FET ($Q_{1A}$) 211, low-side (bottom) FET ($Q_2$) 221, and capacitor 202. The second power loop 272 includes high-side (top) FET ($Q_{1B}$) 213, low-side (bottom) FET ($Q_2$) 221, and capacitor 204. The two power loops have the same distances between components, and thus have substantially identical impedances. Accordingly, like the first embodiment shown in FIG. 3, physical layout 200B provides dual power loops with substantially equal impedance for an asymmetrical half-bridge (i.e., unequal numbers of FETs for high-side switch 210 and low-side switch 220).

Figure 5:
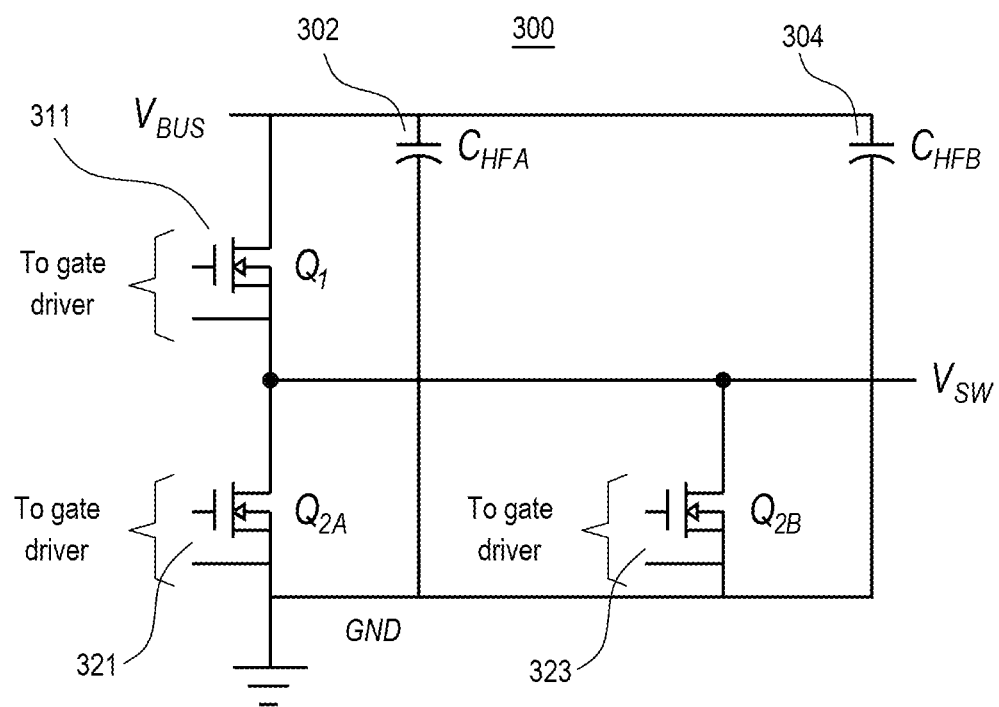
FIG. 5 illustrates an asymmetrical half-bridge circuit in accordance with the present invention with two low-side FETs connected in parallel.

FIG. 5 illustrates an asymmetrical half-bridge circuit 300 in accordance with a further embodiment of the present invention in which the high-side switch 310 is a single FET ($Q_1$) 311, and the low-side switch 320 is formed of two FETs ($Q_{2A}$) 321 and FET ($Q_{2B}$) 323. In asymmetrical half-bridge circuit 300, the low-side switch 320 has more FETs than the high-side switch 310, while in asymmetrical half-bridge circuit 200, the high-side switch 210 has more FETs than the low-side switch 220.

Figure 6:
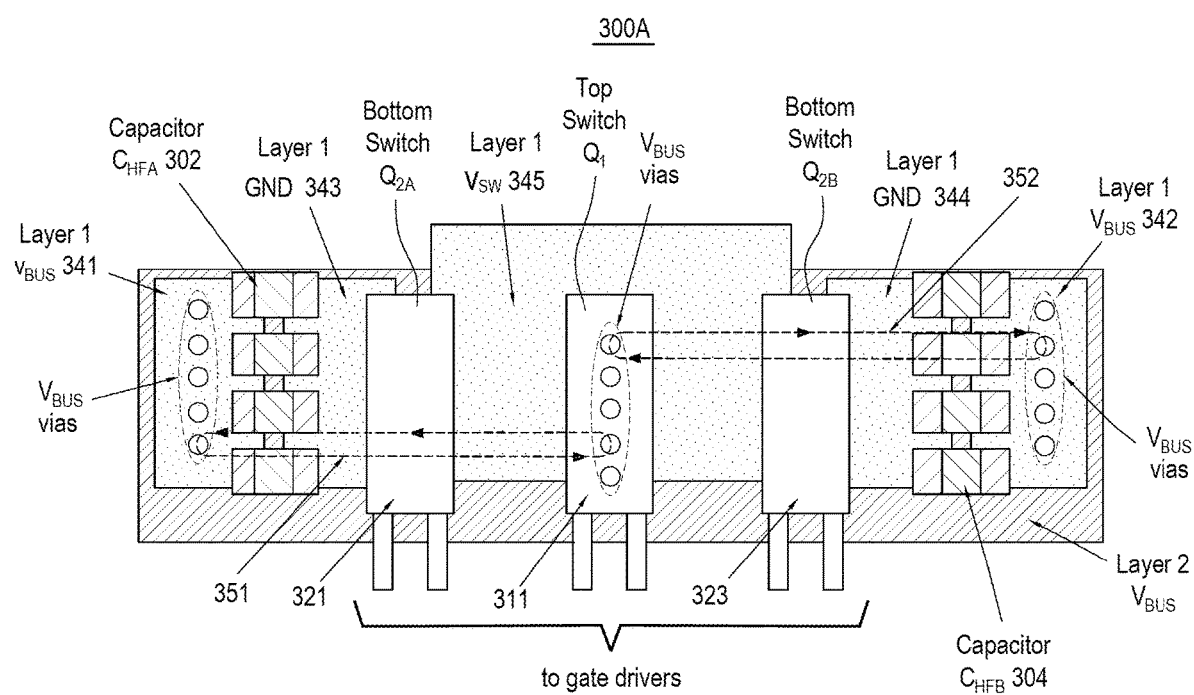
FIG. 6 illustrates the physical layout of the asymmetrical half-bridge circuit of FIG. 5 with capacitors arranged laterally outside respective high-side and low-side FETs.

FIG. 6 illustrates a first embodiment of the physical layout 300A of asymmetrical half-bridge circuit 300. In layout 300A, capacitor 302 is laterally outside FETs 321 and 311 (instead of between FETs 321 and 311), and capacitor 304 is laterally outside FETs 323 and 311. The first layer of the PCB includes a first power $V_{BUS}$ portion 341 and a second power $V_{BUS}$ portion 342, a first GND portion 343 and a second GND portion 344 and a switch-node $V_{SW}$ portion 345. The second layer of the PCB carries $V_{BUS}$.

Physical layout 300A includes a first power loop 351 and a second power loop 352. As shown, the first power loop 351 includes high-side (top) FET ($Q_1$) 311, low-side (bottom) FET ($Q_{2A}$) 321 and capacitor 302. The second power loop 352 includes high-side (top) FET ($Q_1$) 311, bottom FET ($Q_{2B}$) 323 and capacitor 304. The two power loops have the same distances between components, and thus have substantially identical impedances.

Figure 7:
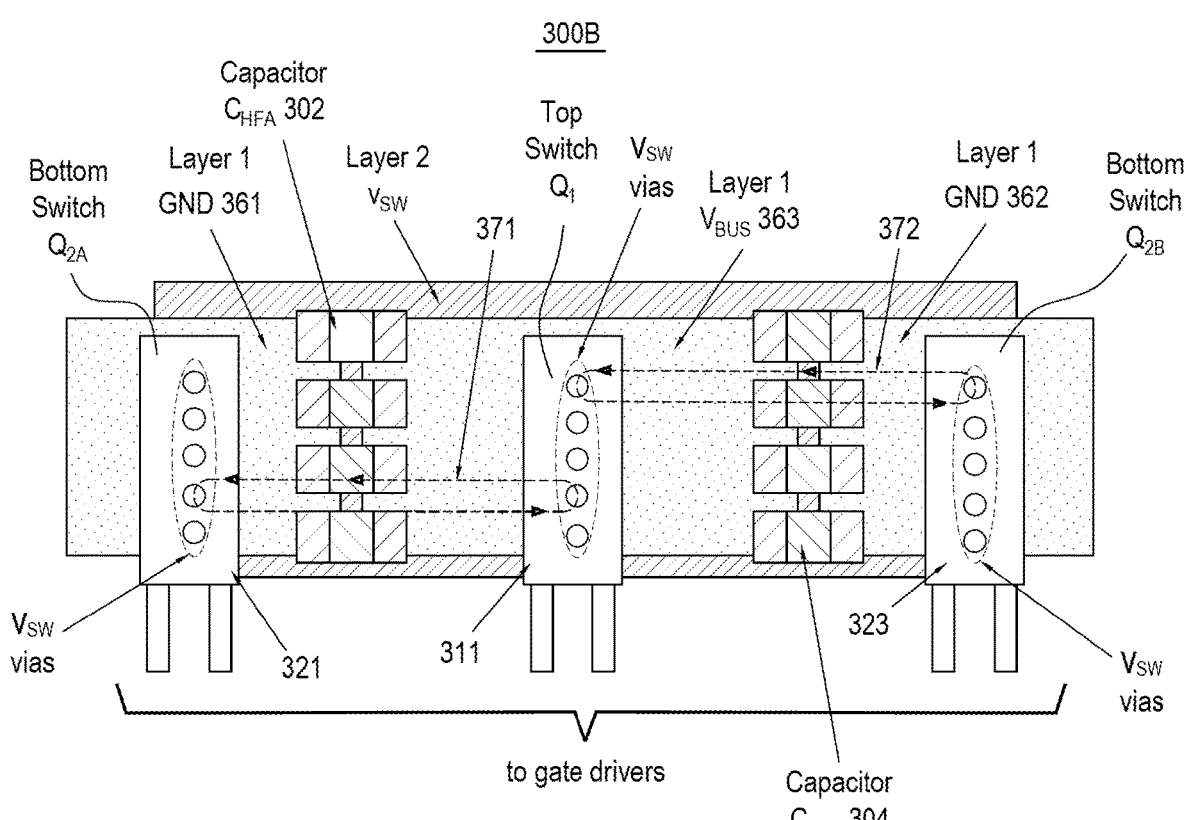
FIG. 7 illustrates yet another physical layout of the asymmetrical half-bridge circuit of FIG. 5 with capacitors arranged between respective high-side and low-side FETs.

FIG. 7 illustrates another physical layout 300B of the asymmetrical half-bridge circuit. In layout 300B, capacitors 302 and 304 are each laterally between, rather than being laterally outside, rather than laterally between, respective low-side (bottom) FET 321/323 and high-side (top) FET 211. The second layer (layer 2) of the PCB serves as the switch node $V_{SW}$, and the first layer (layer 1) of the PCB includes a first GND portion 361, and a second GND portion 362, and a power $V_{BUS}$ portion 363. The first low-side (bottom) FET 321 and the second low-side (bottom) FET 323 on the first layer are each conductively connected to the switch node Vsw of the second layer by respective Vsw vias.

Physical layout 300B includes a first power loop 371 and a second power loop 372. As shown, first power loop 371 includes high-side (top) FET ($Q_1$) 311, low-side (bottom) FET ($Q_{2A}$) 321 and capacitor 302. Second power loop 372 includes high-side (top) FET ($Q_1$) 311, low-side (bottom) FET ($Q_{2B}$) 323 and capacitor 304. The two power loops have the same distances between components, and thus have substantially identical impedances.

In the various above-disclosed embodiments, the substantially equal impedances of the power loops result in good current sharing of the FETs in the leg (high-side switch or low-side switch) with parallel FETs.

Figure 8:
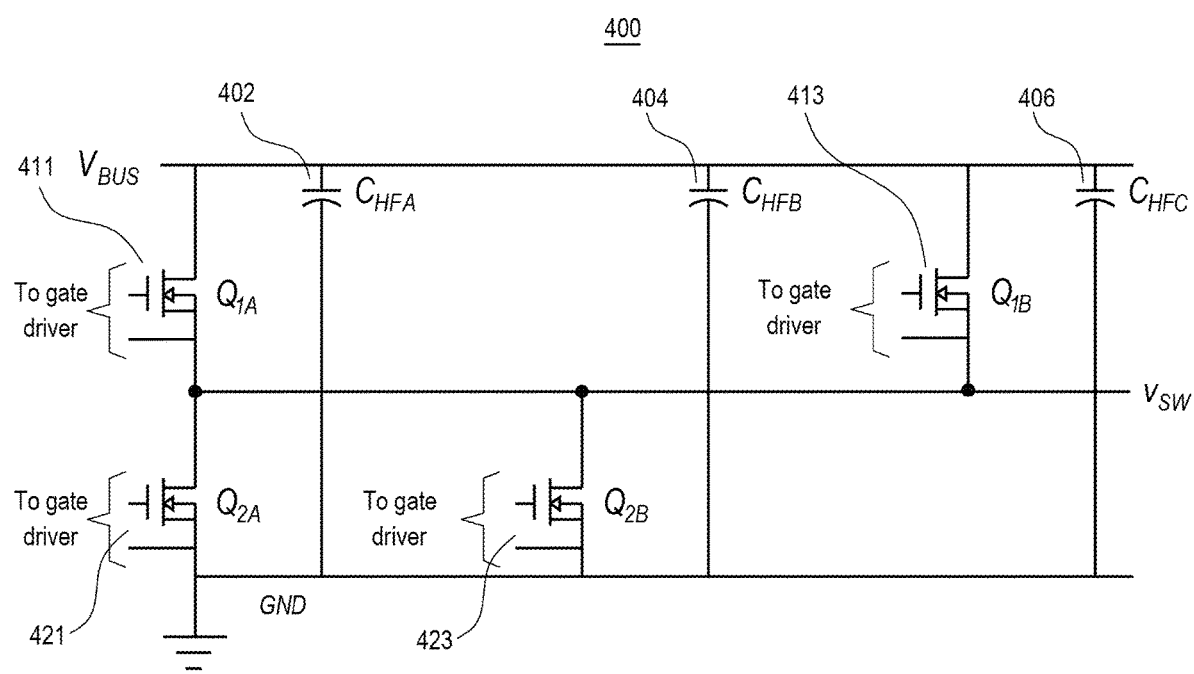
FIG. 8 illustrates a symmetrical half-bridge circuit in accordance with the present invention in which power capability is increased by adding low-side and high-side FETs alternately.

The power capacity of the circuit of the present invention can be advantageously increased by adding one or more FETs and one or more capacitors. FIG. 8 illustrates a half-bridge circuit 400 in accordance with the present invention, in which power capability is increased by adding low-side and high-side FETs alternately. Specifically, low-side FET 423 is added, and high-side FET 413 is added. The low-side switch is thus formed of two parallel FETs 421 and 423, and the high-side switch is formed of two parallel FETs 411 and 413. The half-bridge circuit 400 also includes capacitor 402, capacitor 404, and capacitor 406, each connected between power $V_{BUS}$ and GND.

Figure 9:
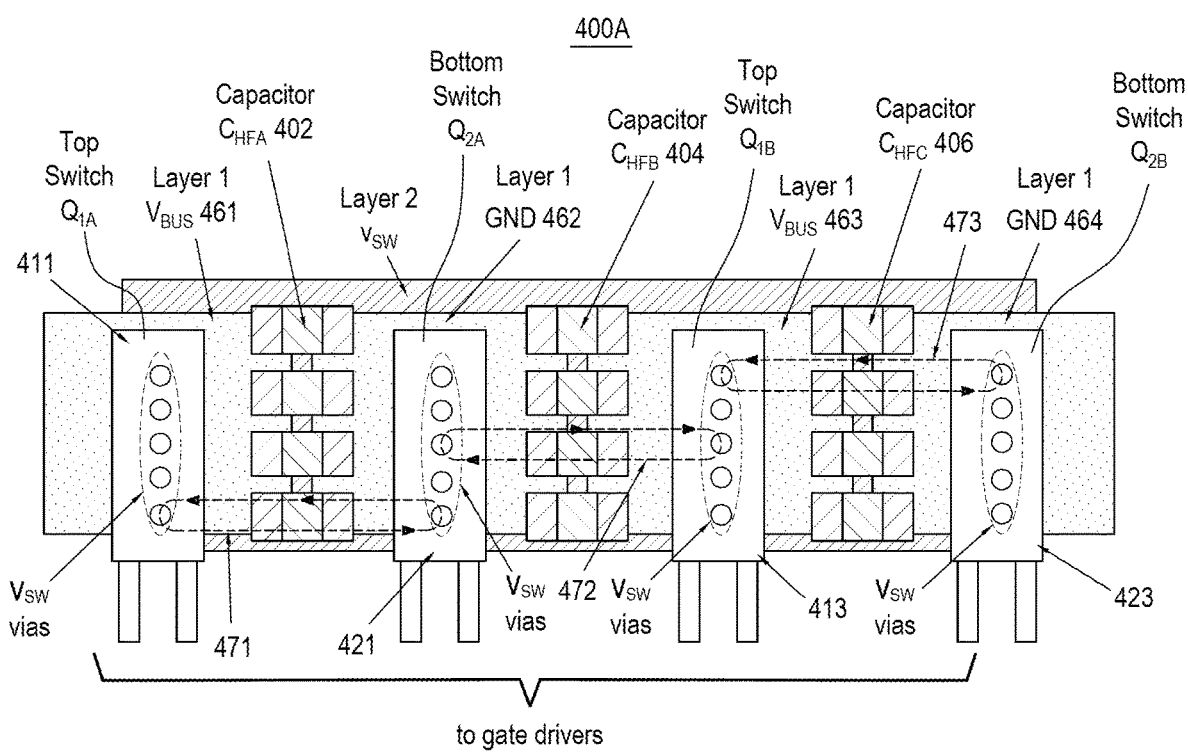
FIG. 9 illustrates the physical layout of the half-bridge circuit of FIG. 8 in accordance with the present invention.

FIG. 9 illustrates a physical layout 400A of the half-bridge circuit of FIG. 8 on a PCB. In layout 400A, capacitors 402, 404, and 406 are each laterally disposed between two FETs. The second layer (layer 2) of PCB serves as the switch node $V_{SW}$, and the first layer (layer 1) of PCB includes a first power $V_{BUS}$ portion 461, a second power $V_{BUS}$ portion 463, a first GND portion 462, and a second GND portion 364. FETs 411, 413, 421, and 423 on the first layer are each conductively connected to the switch node Vsw of the second layer by respective Vsw vias.

Layout 400A includes three power loops: a first power loop 471, a second power loop 472, and a third power loop 472, each including a capacitor and the two FETs (high-side and low-side). As in the previously described embodiments, in layout 400B, the three power loops have substantially equal power loop impedance.

The power handling capability of half-bridge circuit 400 can be further increased by increasing the number of FETs and capacitors, adding the low-side and high-side FETs alternately as described above.

In summary, the half-bridge circuits of the present invention provide significant advantages over prior half-bridge circuits, including:

The asymmetrical half-bridge circuits reduce losses in cases where the design goals result in substantially unequal switch currents.

The PCB circuit layouts of the present invention result in substantially equal power loop impedances.

Within the half-bridge circuit, the switch node connection of each FET sees substantially equal impedance as any other FET.

The number of FETs can be increased as desired so that the power processing capability can be correspondingly increased.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A circuit board layout for a half-bridge circuit, comprising:
    a high-side switch and a low-side switch disposed on a circuit board, wherein only one of the high-side switch and the low-side switch comprises two transistors connected in parallel and disposed on the circuit board in a symmetrical layout, and the other one of the high-side switch and low-side switch comprises a single transistor, and
    two capacitors disposed on the circuit board in a symmetrical layout,
    wherein each of the two transistors connected in parallel forms a power loop with the single transistor and one of the two capacitors, resulting in two power loops having substantially equal impedance due to the symmetrical layout of the two transistors and the two capacitors.

2. The circuit board layout of claim 1, wherein the two transistors comprise FET transistors.

3. The circuit board layout of claim 1, wherein the two transistors connected in parallel have substantially equal impedance to a switch node.

4. The circuit board layout of claim 1, wherein the two capacitors are disposed laterally outside the high-side transistor and the low-side transistor of the power loop.

5. The circuit board layout of claim 1, wherein the two capacitors are disposed laterally between the high-side transistor and the low-side transistor of the power loop.

6. A circuit board layout for a half bridge circuit, comprising:
   a high-side switch and a low-side switch disposed on a circuit board, wherein the high-side switch and the low-side switch each comprise two transistors connected in parallel and disposed on the circuit board in a symmetrical layout, and
   three capacitors disposed on the circuit board in a symmetrical layout,
   wherein each of the two transistors connected in parallel forms a power loop with another respective low-side transistor or high-side transistor and one of the three capacitors, resulting in three power loops, the three power loops having substantially equal impedances due to the symmetrical layout of the two transistors and the three capacitors.

7. A circuit board layout for a half-bridge circuit, comprising:
   a high-side switch and a low-side switch disposed on a circuit board, wherein at least one of the high-side switch and the low-side switch comprises at least two transistors connected in parallel and disposed on the circuit board in a symmetrical layout, and
   a plurality of capacitors disposed on the circuit board in a symmetrical layout, each capacitor forming a power loop with a high-side transistor and a low-side transistor,
   wherein the power loops of the half-bridge circuit have substantially equal impedance due to the symmetrical layout of the at least two transistors and the plurality of capacitors, and
   wherein the high-side and the low-side transistors are disposed alternately with a respective capacitor of each power loop disposed between the high-side and low-side transistors.

8. The circuit board layout of claim 7, wherein the high-side switch comprises at least two transistors connected in parallel.

9. The circuit board layout of claim 7, wherein the low-side switch comprises at least two transistors connected in parallel.

* * * * *